United States Patent [19]

Ishii et al.

[11] Patent Number: 5,086,322
[45] Date of Patent: Feb. 4, 1992

[54] INPUT PROTECTION CIRCUIT AND OUTPUT DRIVER CIRCUIT COMPRISING MIS SEMICONDUCTOR DEVICE

[75] Inventors: Tatsuya Ishii; Takashi Miyakawa, both of Hyogo, Japan

[73] Assignee: Mitsubishi Denki Kabushiki Kaisha, Tokyo, Japan

[21] Appl. No.: 422,556

[22] Filed: Oct. 17, 1989

[30] Foreign Application Priority Data

Oct. 19, 1988 [JP] Japan .................... 63-264657
Apr. 27, 1989 [JP] Japan .................... 1-109705

[51] Int. Cl.$^5$ .............. H01L 29/10; H01L 29/78; H01L 29/68; H01L 29/04
[52] U.S. Cl. .................... 357/23.3; 357/23.8; 357/23.12; 357/59
[58] Field of Search ............ 307/296.2, 270, 304, 307/256, 297; 357/23.14,23.6,23.13,23.3,23.8,23.9,23.12,59 G, 59 H, 59 K

[56] References Cited

U.S. PATENT DOCUMENTS

| 3,980,899 | 9/1976 | Shimada et al. | 307/270 |
|---|---|---|---|
| 4,153,906 | 5/1979 | Shinoda et al. | 357/23.12 |
| 4,285,116 | 8/1981 | Meguro . | |
| 4,353,086 | 10/1982 | Jaccodine et al. | 357/23.6 |
| 4,378,506 | 3/1983 | Taira | 307/296.2 |

FOREIGN PATENT DOCUMENTS

| 0228762 | 12/1984 | Japan | 357/23.14 |
|---|---|---|---|
| 2208452A | 3/1989 | United Kingdom . | |

OTHER PUBLICATIONS

Hsu et al., "Multiple V-Groove FET", IBM Technical Disclosure Bulletin, vol. 19, No. 6 (Nov. 1976), pp. 2135-2136.
Anantha et al., "Self-Aligned IGFET with Silicon Dioxide Isolated Source and Drain", IBM Technical Disclosure Bulletin, vol. 22, No. 11 (Apr. 1980), pp. 4895-4899.
OH et al., "A New MOSFET Structure with Self-Aligned Polysilicon Source and Drain Electrodes", IEEE Electron Device Letters, vol. EDL-5, No. 10 (Oct. 1984), pp. 400-402.

*Primary Examiner*—Rolf Hille
*Assistant Examiner*—Mahshid Saadat
*Attorney, Agent, or Firm*—Lowe, Price, LeBlanc & Becker

[57] ABSTRACT

An MIS transistor comprises first and second concave grooves (17, 17) opposing to each other with a gate electrode (4, 39) provided therebetween. Source and drain regions (8a, 8b, 31, 34) are formed on sidewalls of the concave grooves. A configuration of the sidewall surface of the concave groove is selected such that a current density of a punch through current between the source and drain regions becomes uniform. Furthermore, a concave groove having such a configuration, for example, a taper configuration in which a space between sidwwall surfaces becomes narrower toward a bottom portion of the substrate, is formed by the reactive ion etching.

The MIS transistor is employed in an input protection circuit or an output driver circuit, which enables high integration of the device and improves an input breakdown voltage.

11 Claims, 13 Drawing Sheets

INPUT PROTECTION CIRCUIT AND OUTPUT DRIVER CIRCUIT COMPRISING MIS SEMICONDUCTOR DEVICE

FIELD OF THE INVENTION

The present invention relates to a structure of a highly integrated MIS semiconductor device having high breakdown voltage, and structures of an input protection circuit and an output driver circuit comprising the MIS semiconductor device. The invention further relates to a method of manufacturing the MIS semiconductor device.

BACKGROUND OF THE INVENTION

In a semiconductor integrated circuit device, an internal signal is externally outputted through an output driver circuit. The output driver circuit is provided for driving an external circuit with a large current. FIG. 9 is a plan view showing a structure of a conventional representative output driver circuit. Referring to FIG. 9, an output driver circuit 1 comprises a first n channel MIS (Metal Insulator Semiconductor) transistor 2 and a second n channel MIS transistor 3. A gate electrode 4 of the first n channel MIS transistor 2 is connected to an input line 5 on a Low side of an internal circuit. A gate electrode 6 of the second n channel MIS transistor 3 is connected to an input line 7 on a High (Hi) side of the internal circuit. Source regions 8a of the first n channel MIS transistor 2 are connected to a ground line 9. Drain regions 10b of the second n channel MIS transistor 3 are connected to a power supply line 11. In addition, drain regions 8b of the first n channel MIS transistor 2 and source regions 10a of the second n channel MIS transistor 3 are connected to an output line 12.

Now, a sectional structure of the first n channel MIS transistor 2 will be described. FIG. 10 is a sectional view showing a structure of the first n channel MIS transistor 2 seen from the direction of a line X—X in FIG. 9. The gate electrode 4 is formed on a surface of a p-type silicon substrate 13 through a gate insulating film 14. The gate electrode 4 is continuously formed on the surface of the p-type silicon substrate 13 in a manner similar to zigzag fashion. (Referred to FIG. 9). Source and drain regions 8a and 8b of n-type impurity regions are alternately formed between straight portions of the gate electrode 4 on the surface of the p-type silicon substrate 13. The ground line 9 is connected to the source regions 8a. The output line 12 is connected to the drain regions 8b. A periphery of the gate electrode 4 is covered with an insulating film 15. In addition, surfaces of the insulating film 15, the ground line 9 and the output line 12 are covered with a surface protection film 16.

The second n channel MIS transistor 3 has the same sectional structure as that shown in FIG. 10. Thus, MIS transistors of the output driver circuit are formed such that the gate electrodes 4 and 6 are continuously routed on a plane, thereby increasing a gate width or a width of a channel formed under the gate of a transistor, so that a current driving capability of the MIS transistor is enhanced.

Now, an operation of the output driver circuit will be described. FIG. 11 is an equivalent circuit diagram of the output driver circuit 1 shown in FIG. 9. Referring to FIG. 11, the first and the second n channel MIS transistors 2 and 3 are connected in series to each other. A drain region 10b of the second n channel MIS transistor 3 is connected to a power supply line 11. A source region 8a of the first n channel MIS transistor 2 is connected to a ground line 9. A gate electrode of the first n channel MIS transistor 2 is connected to an input line 5 on the Low side, and a gate electrode of the second n channel MIS transistor 3 is connected to an input line 7 on the Hi side. An output line 12 is connected to a connection portion between the two n channel MIS transistors 2 and 3.

First, when a positive voltage is applied from the input line 7 on the Hi side, the second n channel MIS transistor 3 is turned on, so that a power supply voltage $V_{cc}$ is outputted to the output line 12.

On the other hand, when a positive voltage is applied from the input line 5 at the Low side, the first n channel MIS transistor 2 is turned on, so that a ground potential is outputted to the output line 12. Since in the first and the second n channel MIS transistors 2 and 3, increased gate widths enhance the current driving capability, current amount externally inputted/outputted through the output line 12 can be increased.

In addition, the output driver circuit 1 also serves as an input protection circuit, which will be described in the following. For example, referring to FIG. 11, it is assumed that a positive over-current is applied from the side of the output line 12. In this case, a punch through phenomenon is caused between the source and drain regions of the first n channel MIS transistor 2 and the second n channel MIS transistor 3 so that a punch through current flows, whereby an over-current flows to the side of the power supply line 11 or to the side of the ground line 10, thus preventing the over-current from flowing to the side of the input lines 5 and 7 and protecting the internal circuit.

A function for protecting an input will be further described with reference to a result of an electrostatic breakdown test of input/output terminals of a semiconductor integrated circuit device. FIG. 12 is a schematic diagram of a test circuit employed in a testing method referred to as capacitor charging method. The capacitor charging method is a method of testing an electrostatic breakdown voltage of a semiconductor circuit by storing a charge in a capacitor through a direct current power supply, then discharging by means of switch the charge stored in the capacitor to a sample device (semiconductor integrated circuit) through a resistor. In the electrostatic breakdown test device, a resistance of a resistor R is 1.5 kΩ and a capacitance of a capacitor is 100 pf. FIG. 13 shows a sectional structure of the MIS transistor of the input driver circuit of the sample device (semiconductor integrated circuit). The MIS transistor shown in the drawing corresponds, for example, to a first n channel MIS transistor 2 of an output driver circuit. Numerals shown in the drawing indicate sizes of elements. A drain region 10b, a source region 10a and a gate electrode 7 are set to +12 V, 0 V and a floating state, respectively. In this state, a depletion layer is extended between the source and drain regions, so that a punch through current starts flowing. FIG. 14 is a diagram showing a potential distribution of MIS transistor. In FIG. 14, lines indicate equipotential lines. A voltage of a channel region under the gate gradually drops from 12 V on the side of the drain region 10b to 0 V on the side of the source region, wherein a punch through current flows. FIG. 15 shows a current density distribution in this state. It is understood from the drawing that a current flows under the gate.

When a negative over-current is applied from the side of the output line 12, it becomes a forward voltage to the p-type silicon substrate 13, so that a current flows in the substrate. Thus, the output driver circuit operates as an input protection circuit.

However, assuming that an additional over-current is applied, a drain voltage is raised, then the depletion layer is further extended and an electric field between the source and drain regions becomes a higher electric field. However, a ratio of the increase of amount of a punch through current is larger as compared with that of the extension of the depletion layer. As a result, the current density of the punch through current is increased. Then, when the current density of the punch through current is excessively increased, the punch through current does not sufficiently flow. Then, a high electric field is generated near the drain, so that the gate oxide film or a pn junction on the drain side is destroyed to generate a current path. This state is shown by arrows A and B in FIG. 13.

Although a target breakdown voltage for input/output terminals of a semiconductor integrated circuit is originally 3 kV, the electrostatic breakdown voltage of the above described MIS transistor was about 1.5 kV. As semiconductor integrated circuits are more highly integrated recently, a target breakdown voltage is not achieved in a miniaturized MIS transistor.

A similar problem occurs in a conventional input protection circuit of a semiconductor device, which will be described in the following. FIG. 19 is a circuit diagram of an input protection circuit. The input protection circuit comprises a single MIS transistor 30. A drain region 31 of the MIS transistor 30 is connected to a resistor 32 and a circuit 33 to be protected, and a source region 34 and a gate electrode 35 are connected to ground potentials 36 and 36.

FIG. 20 is a sectional view of a structure of the MIS transistor 30. The source region 34 and the drain region 31 are formed spaced apart on a major surface of a semiconductor substrate 38. A silicon oxide film 39 is formed on the major surface of the semiconductor substrate between the source and drain regions 34 and 31. Aluminum interconnection layers 40 and 41 are respectively connected to the source and drain regions 34 and 31. In addition, a part of the aluminum interconnection layer 41 connected to the source region 34 extends on an upper portion of the silicon oxide film 39 to form a gate electrode 35. An upper portion of the semiconductor substrate 38 is covered with an insulating film 42.

Now, an operation of a conventional input protection circuit will be described. Referring to FIG. 19 and 20, when an abnormally high voltage is applied to an input terminal 37, a high voltage is applied to the drain region 31 of the MIS transistor 30. The high voltage causes the punch through phenomenon between the source and drain regions, so that a current flows to the side of the ground potential 36 through the source region 34, thus preventing application of an abnormally high voltage to the side of the circuit 33 to be protected.

In the above described input protection circuit, a gate width of the MIS transistor 30 should be increased in order to improve an input breakdown voltage. However, due to miniaturization of a recent semiconductor device, a gate width cannot be increased, and the increase of a gate width results in prevention of miniaturization or high integration of the device.

SUMMARY OF THE INVENTION

An object of the present invention is to implement a highly integrated structure of an MIS transistor.

Another object of the present invention is to improve a breakdown voltage of a drain of an MIS transistor.

A further object of the present invention is to miniaturize a structure of an output driver circuit comprising an MIS transistor.

A still another object of the present invention is to improve a function of an output driver circuit for protecting input.

A still further object of the present invention is to improve a breakdown voltage of a drain of an MIS transistor included in an output driver circuit.

A still further object of the present invention is to provide a method of manufacturing a miniaturized output driver circuit device A still further object of the present invention is to miniaturize a structure of an input protection circuit comprising an MIS transistor.

A still further object of the present invention is to improve a breakdown voltage of a drain of an MIS transistor included in an input protection circuit.

An MIS semiconductor device according to the present invention comprises first and second concave grooves opposing to each other with a gate electrode provided therebetween. Impurity regions constituting source and drain regions are formed on sidewalls of the concave grooves. Opposing areas of the source and drain regions are increased compared with those of a conventional MIS semiconductor device. A depletion layer region extending from the side of the drain region is extended, so that a path for a punch through current is enlarged, thus reducing a current density between the source and the drain, whereby an electrostatic breakdown voltage of the MIS transistor can be improved.

According to another aspect of the present invention, an output driver circuit and an input protection circuit are formed of the above described MIS semiconductor device. With the provision of an MIS semiconductor device having a high breakdown voltage, functions of the circuits for protecting input of an abnormally high voltage can be improved.

According to a still another aspect of the present invention, in an MIS semiconductor device, first and second concave grooves are formed spaced apart from each other in a semiconductor substrate. The concave grooves are formed so as to have side surfaces opposing to each other, and the configuration is controlled, for example, by a reactive ion etching in one embodiment, thereby increasing opposing areas of source and drain regions of the MIS semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16, 17 and 18 are diagrams showing a result of a simulation of a punch through phenomenon between trenches using a simulation method, wherein FIG. 16 is a structural view of a trench employed in the simulation, FIG. 17 is an equipotential distribution diagram showing the result of the simulation, and FIG. 18 is a current density distribution diagram showing the result of the simulation.

DESCRIPTION OF THE PREFERRED EMBODIMENTS

One embodiment of the present invention will be described in reference to the drawings in the following.

Figure 1:
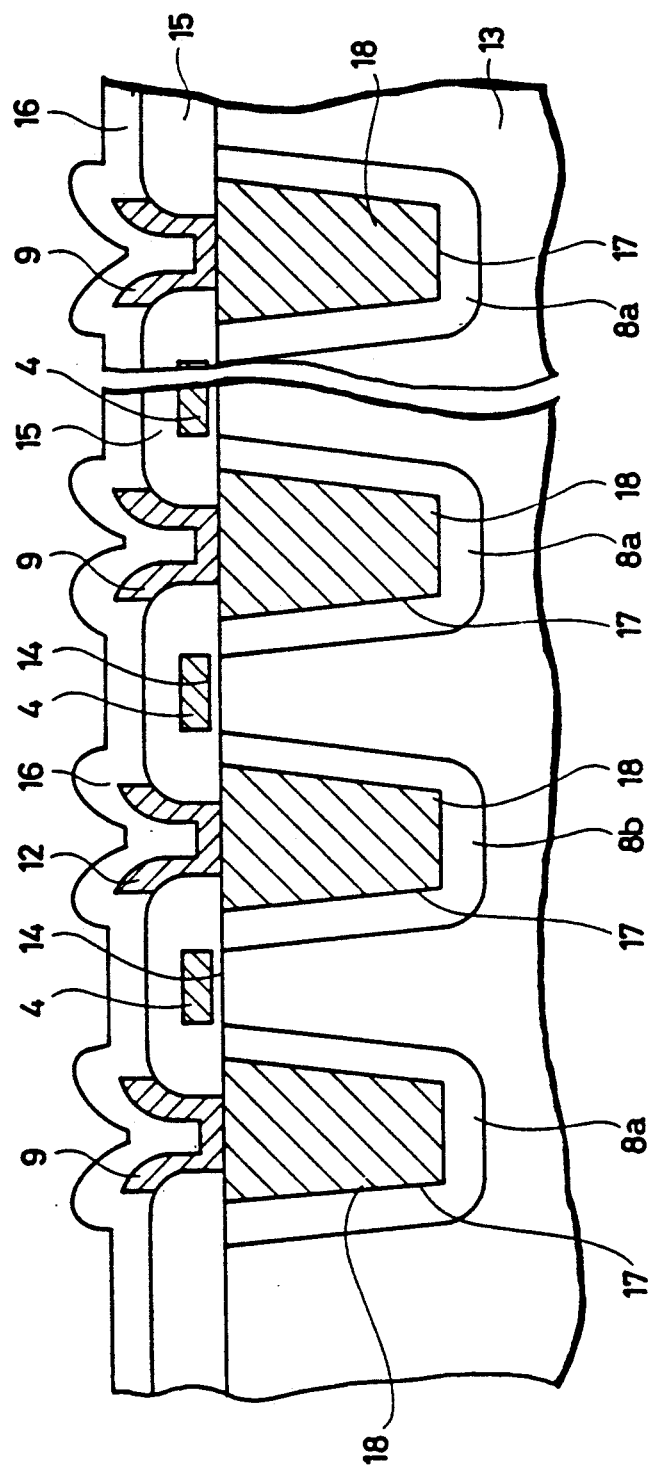
FIG. 1 is a sectional view of a structure of an MIS transistor employed in an output driver circuit of a first embodiment of the present invention.
Figure 9:
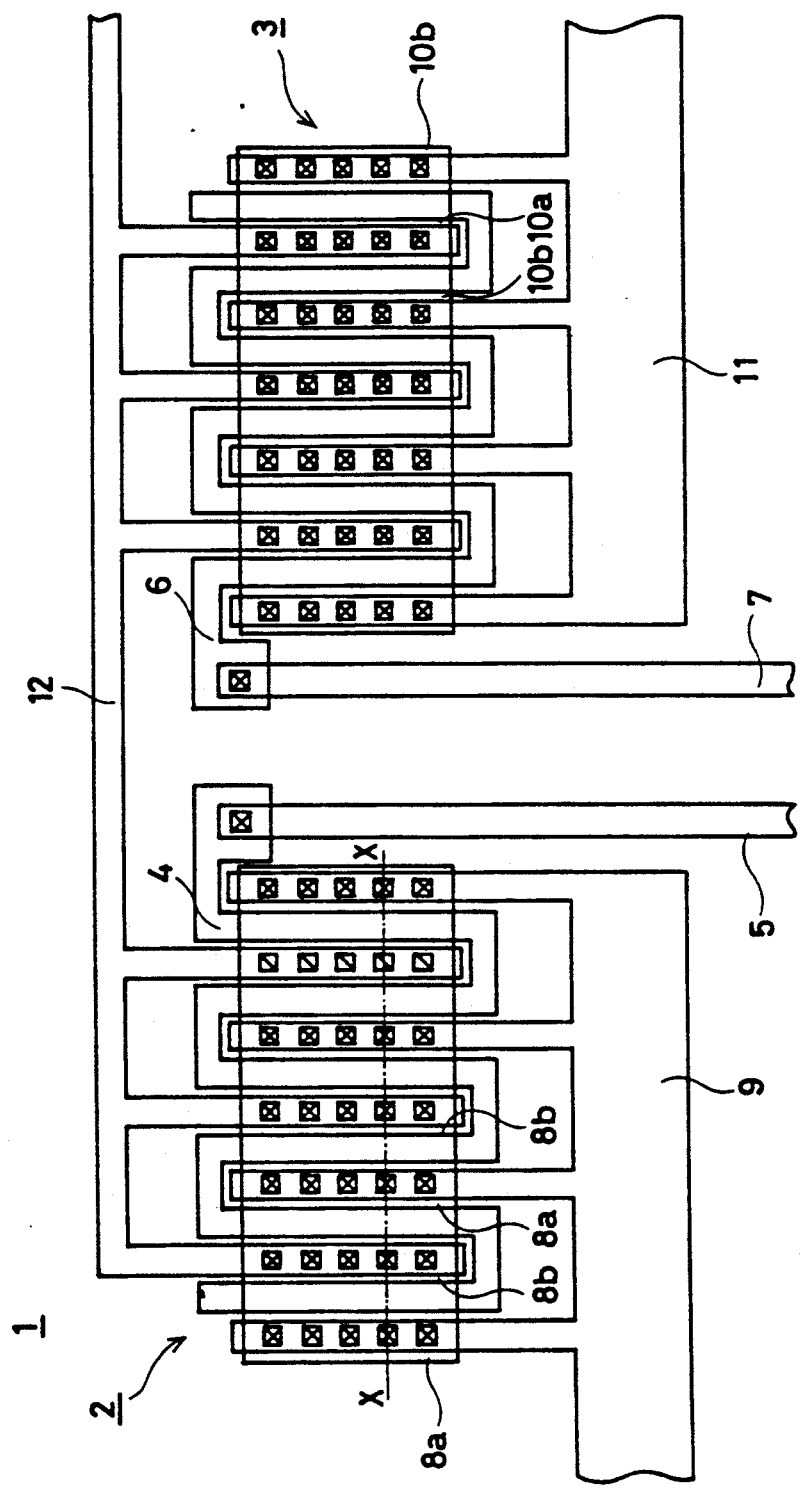
FIG. 9 is a plan view of a structure of an output driver circuit.
Figure 10:
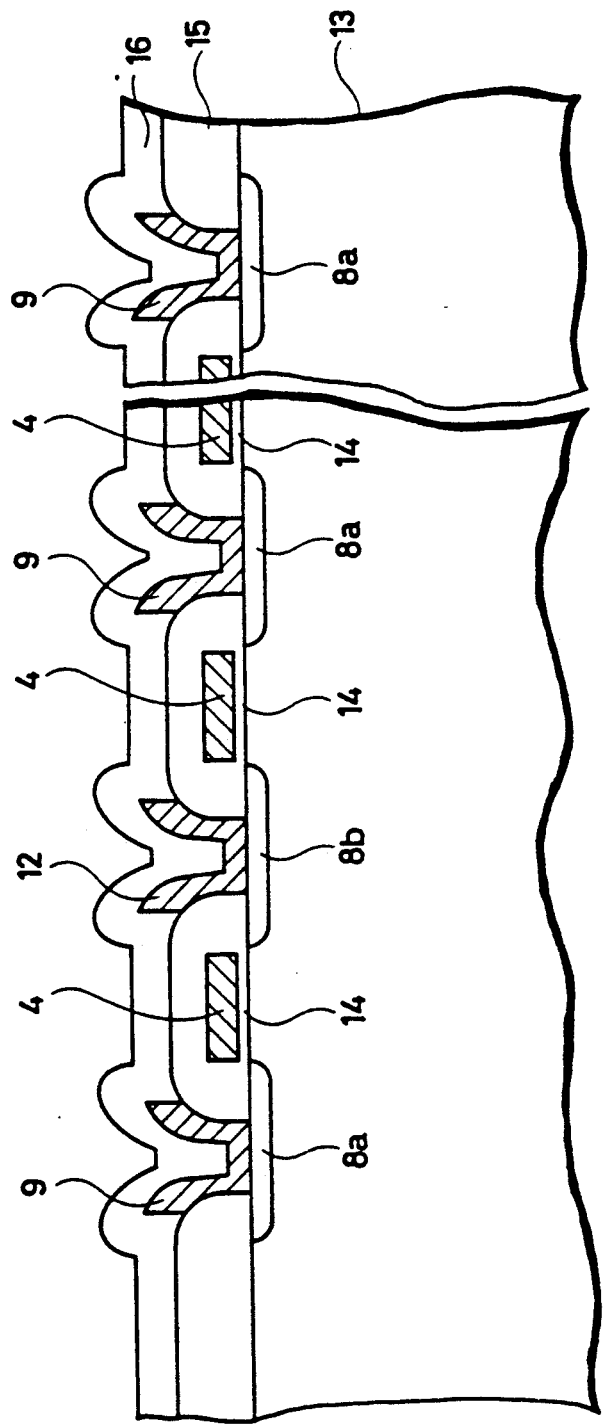
FIG. 10 is a sectional view of a structure of an MIS transistor employed in a conventional output driver circuit, and also a sectional view of the structure seen from the direction of a line X—X of FIG. 9.
Figure 11:
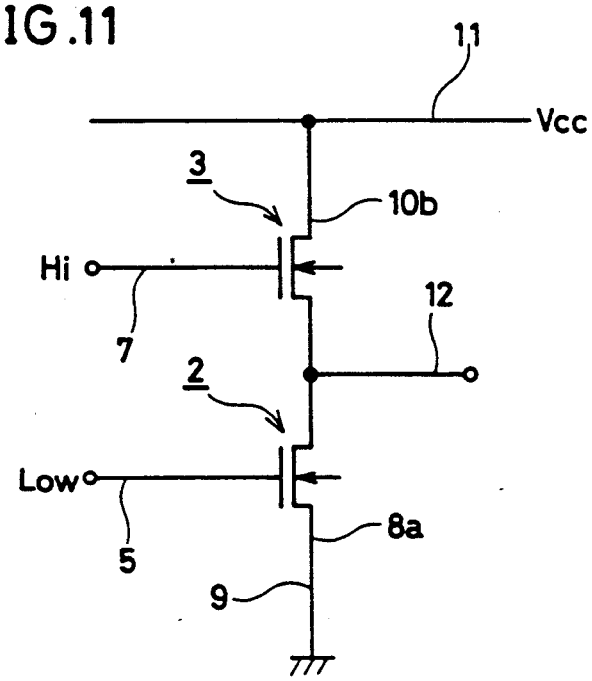
FIG. 11 is an equivalent circuit diagram of an output driver circuit.
Figure 12:
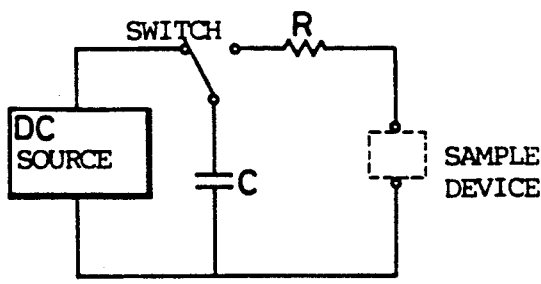
FIG. 12 is a schematic diagram of a test device for testing an electrostatic breakdown voltage of a semiconductor integrated circuit comprising an input/output driver circuit.
Figure 13:
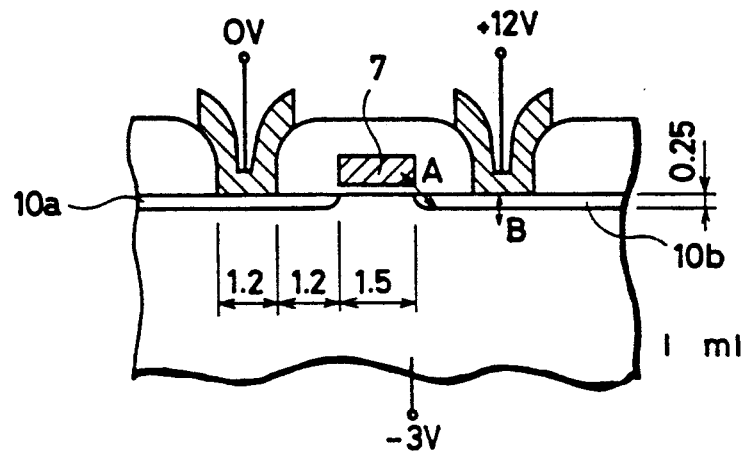
FIG. 13 is a schematic diagram of a structure of an MIS transistor of a sample device employed in the test device shown in FIG. 12.
Figure 14:
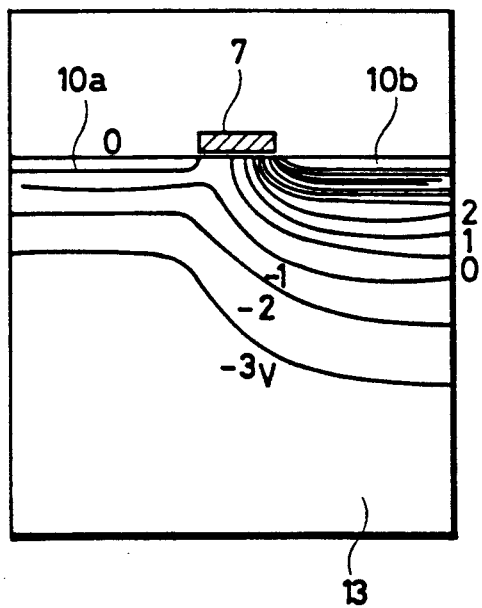
FIG. 14 is an equipotential distribution diagram in a state where a punch through phenomenon of the MIS transistor shown in FIG. 13 occurs.
Figure 15:
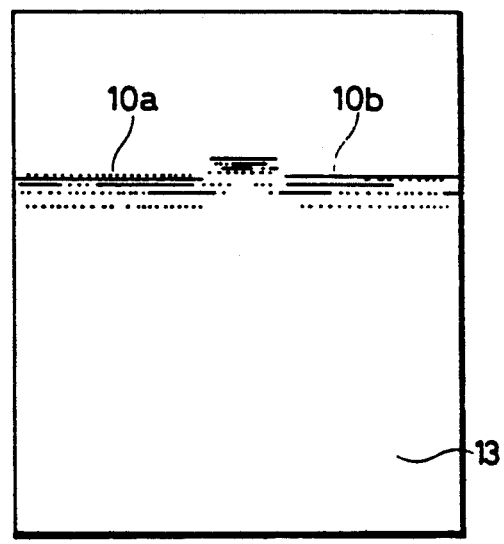
FIG. 15 is a current density distribution diagram in the same state as that of FIGS. 14.

First, a structure of an output driver circuit of a semiconductor integrated circuit device according to the present invention will be described. FIG. 1 is a sectional view of a structure of an MIS transistor of an output driver circuit. Since a plane structure and an equivalent circuit diagram of the output driver circuit are the same as those described above and shown in FIG. 9 and FIG. 11, these drawings are applied in the following description. FIG. 1 is a sectional view of a structure of a first n channel MIS transistor 2 taken from the direction along a line X—X shown in FIG. 9. Referring to FIG. 1, a plurality of concave grooves 17 are formed at a predetermined interval on a surface of a p-type silicon substrate 13. Conductors 18 made of polysilicon are formed inside the concave grooves 17. Ground line 9 and output lines 12 are alternately connected to surfaces of the conductors 18. Source and drain regions 8a and 8b of n-type impurity regions are formed on surface regions of the concave grooves 17. Gate electrodes 4 are formed on a surface of the semiconductor substrate 13 between the plurality of concave grooves 17 through a gate insulating film 14. Surfaces of the gate electrodes 4 are covered with an insulating film 15. An upper portion of the ground line 9 and the like are covered with a surface protection film 16.

In the above described structure, the present invention is characterized by an improved configuration of the source and drain regions 8a and 8b having surfaces opposing to each other. The configuration of the source and drain regions 8a and 8b formed on the sidewalls of the concave grooves 17 are made so as to reflect the configuration of the concave grooves 17. Accordingly, it is important to make a configuration of the sidewalls of the concave grooves 17 optimum. In order to determine a sidewall configuration of the concave groove 17, a simulation method of the punch through phenomenon is applied, wherein a configuration of the sidewalls of the concave grooves 17 is determined such that a current path of a punch through current can be the largest when the punch through phenomenon occurs. The simulation process will be described in the following.

Figure 18:
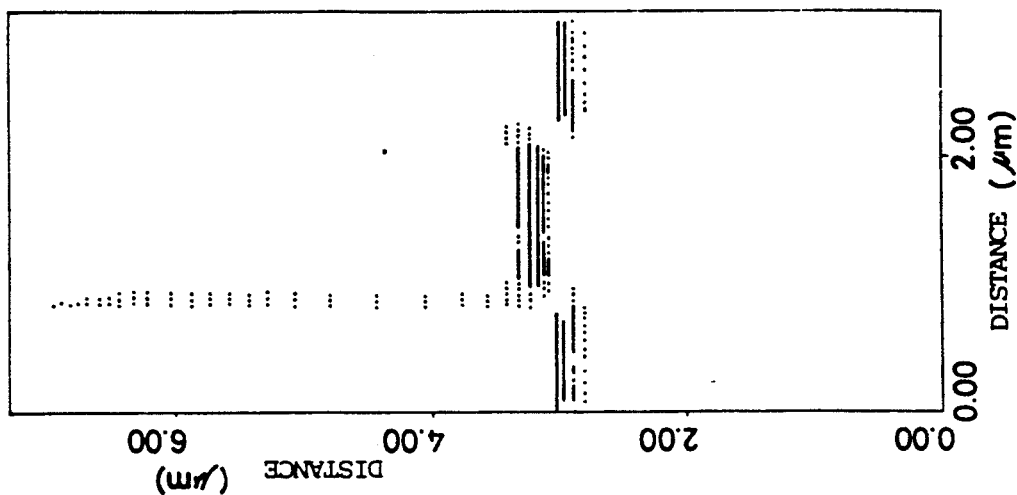
Figure 17:
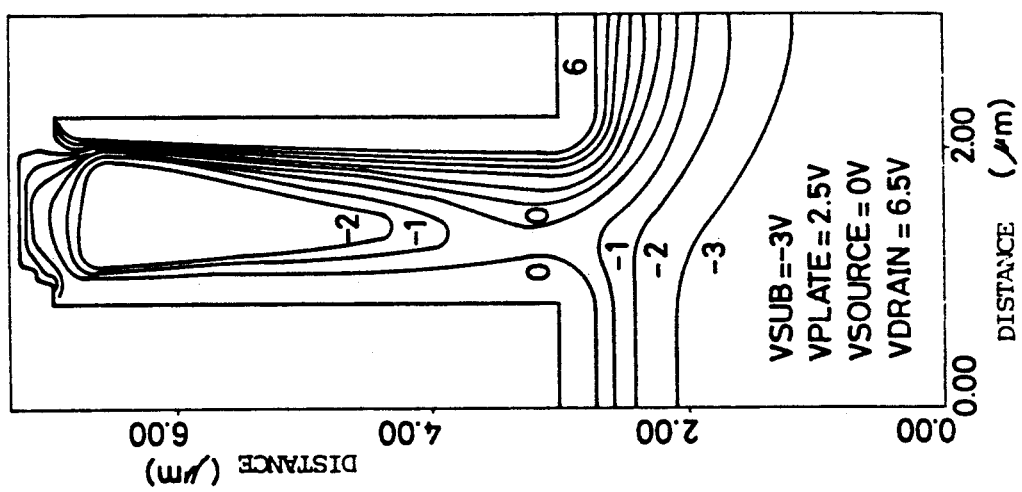
Figure 16:
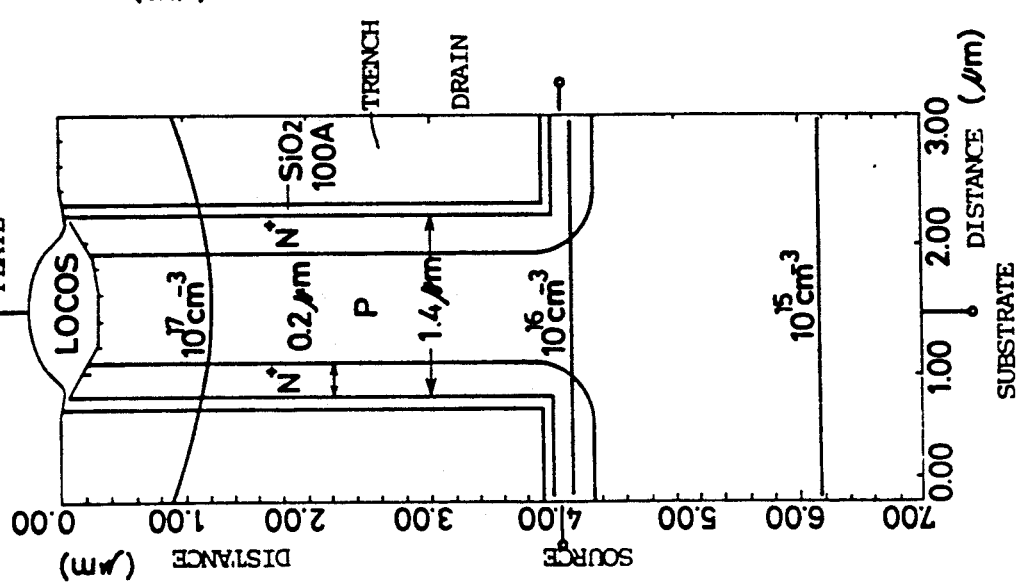

FIGS. 16 through 18 are diagrams showing a result of a simulation of the punch through phenomenon between trenches when a configuration of the concave groove 17 is determined to have be a trench configuration having a vertical sidewall. The simulation result is described in IEICE (The Institute of Electronics, Information and Communication Engineers of Japan) Technical Report, Vol. 87, No. 164, SDM 87-84. FIG. 16 is a diagram showing a structure of a trench to be simulated. Impurities are implanted in the gaussian distribution manner under the conditions that a space between the trenches is 1.4 μm, a depth of the trench is 4.0 μm, and a surface concentration of an n+ region in a sidewall of the trench is $10^{19}$ cm$^{-3}$. The trenches are formed in a p well layer. FIG. 17 is a diagram showing a potential distribution in a state where voltages of −3 V, 0 V, 2.5 V and 6.5 V are applied to the substrate, the side of the source, the plate and the side of the drain, respectively, and shows a state when the punch through current starts flowing between the trenches. It is understood from the drawing that an equipotential line of 0 V is close to each other near a bottom portion of the trench. FIG. 18 is a diagram showing a current density distribution in a state shown in FIG. 17. It is clear from the drawing that the punch through current flows near the bottom portion of the trench where the equipotential line of 0 V is close to each other. Accordingly, it will be understood that in order to flow the punch through current uniformly between the trenches from an upper portion to the bottom portion thereof, a trench configuration is formed such that the equipotential line of 0 V is uniformly close to each other from the upper portion to the bottom portion of the trench.

Figure 4:
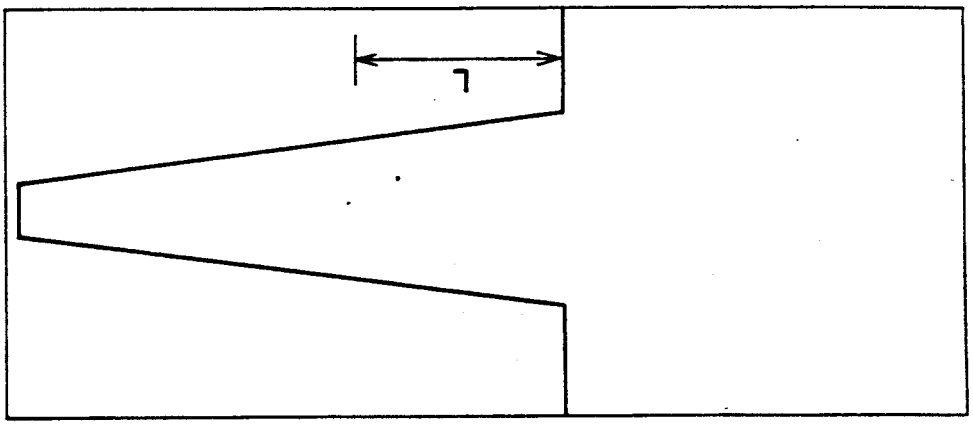
FIG. 4 is a view of a sidewall of an adequate concave sidewall configuration obtained from the results of the simulation of FIG. 2 and FIG. 3.
Figure 3:
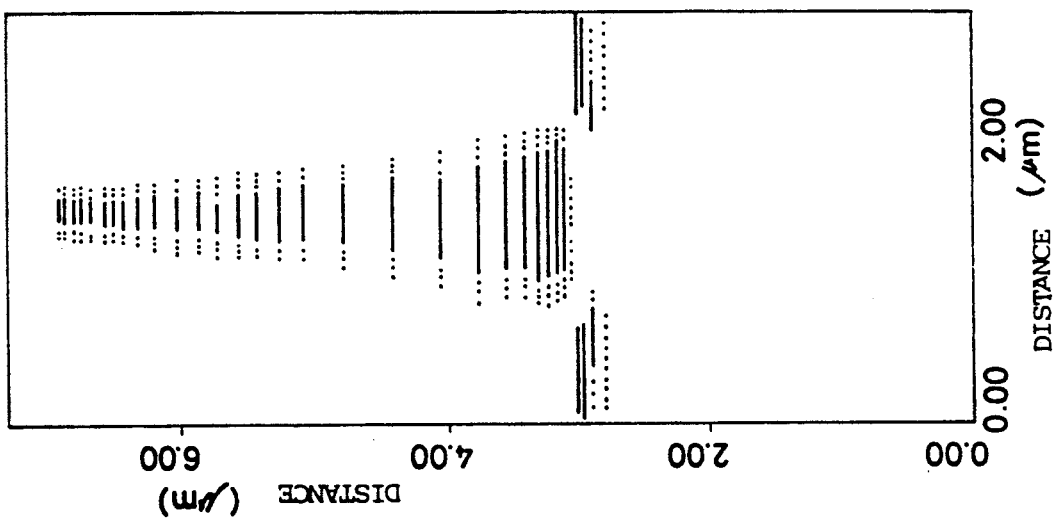
FIG. 3 is a diagram of a current density distribution showing a result of a simulation similar to FIG. 2.
Figure 2:
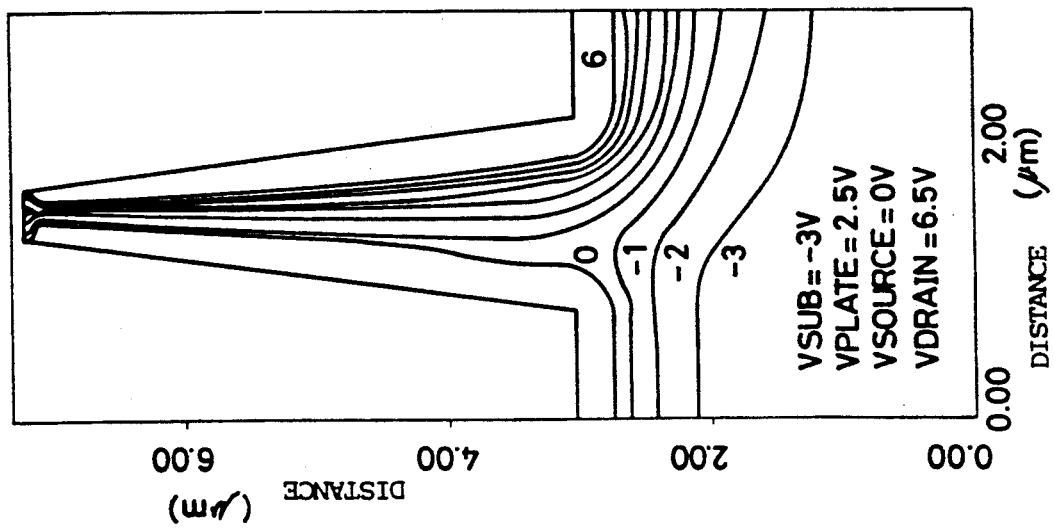
FIG. 2 is a diagram showing an equipotential distribution resulting from a simulation of a punch through phenomenon caused between concave grooves of inverse taper configuration.

A further simulation is performed based on the above observation. The result is shown in FIGS. 2 through 4. FIG. 2 is a potential distribution diagram when a configuration of the sidewall of the concave groove is an inverse taper configuration. As described above, the depletion layer is not extended greatly near the upper portion of the trench compared with the bottom portion thereof. Accordingly, a space between the trenches is made narrower in the upper portion and is gradually made wider toward the bottom portion. As a result of the formation of the inverse taper sidewall, the equipotential line of 0 V extends evenly toward the direction of the depth of the trench. FIG. 3 shows a distribution of the current density of the structure shown in FIG. 2. As understood from the drawing, a uniform punch through current flows between the trenches. FIG. 4 is a diagram showing a sidewall configuration of the trench from which the simulation result shown in FIG. 3 is obtained. A configuration of the part indicated by L in the drawing is employed for the sidewall configuration of the concave groove 17 of the MIS transistor shown in FIG. 1.

An operation of a function of the input protection circuit will be described in reference to the sectional view of the structure of the MIS transistor of the output driver circuit shown in FIG. 1. When a positive over-voltage is applied to the output line 12, a depletion layer is extended to the side of the drain region 8b connected to the output line 12. The sidewall of the concave groove 17 is formed to be an inverse taper configuration by the above described simulation method. Accordingly, the sidewalls of the drain region 8b and the source region 8a have the inverse taper configuration as well. Accordingly, the depletion layer extended from the drain region 8b simultaneously comes in touch with the depletion layer on the side of the source region 8a, from the upper surface of the semiconductor substrate 13 through to the bottom portion thereof, so that the punch through current flows therebetween, thereby preventing the concentration of the punch through current and increase of the current density. When a negative over-voltage is applied to the output line 12, a forward current flows from the p-type silicon substrate 13 toward the drain region 8b. However, since the drain region 8b is extended, a current density in the pn junction is reduced.

Now, a method of manufacturing an MIS transistor of an output driver circuit will be described. FIG. 5A through FIG. 5G are sectional views showing sequential steps of manufacturing the MIS transistor.

Figure 5A:
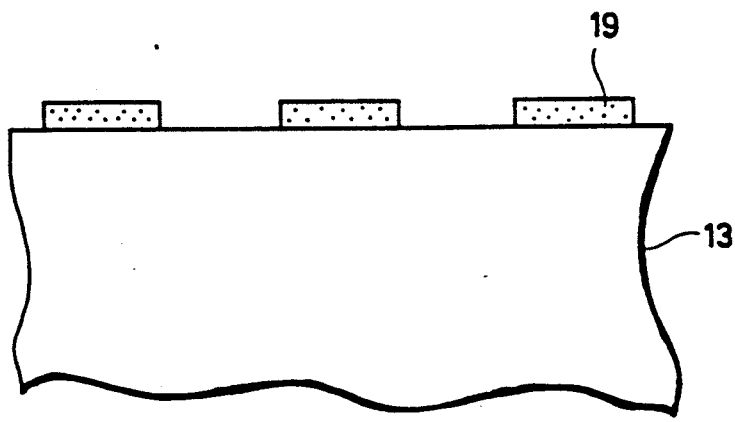
FIGS. 5A, 5B, 5C, 5D, 5E, 5F and 5G are sectional views showing sequential steps of manufacturing the MIS transistor shown in FIG. 1.

First, in FIG. 5A, a thick silicon oxide film 19 is formed on the surface of the p-type silicon substrate 13 by the thermal oxidation method. Then, the silicon oxide film 19 is patterned into a predetermined configuration by the photolithography.

Figure 5B:
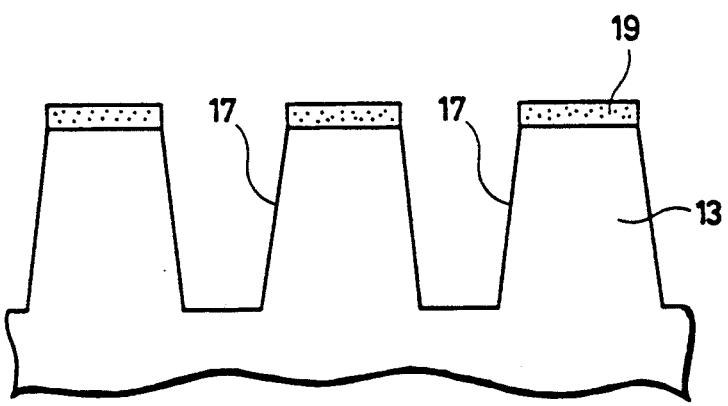
Figure 5C:
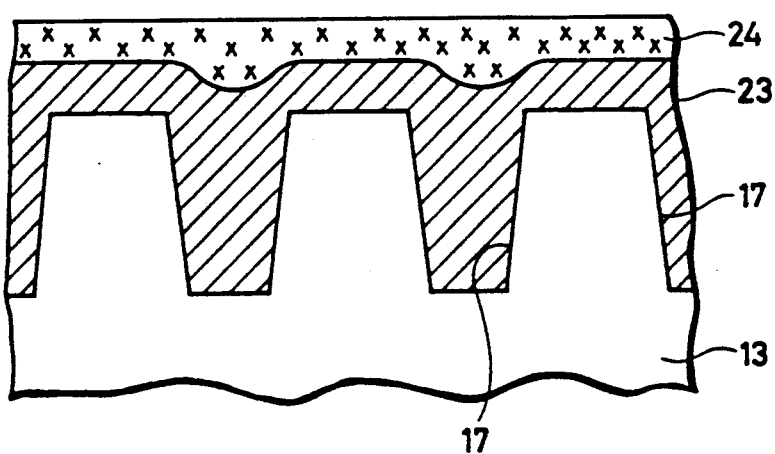
Figure 6:
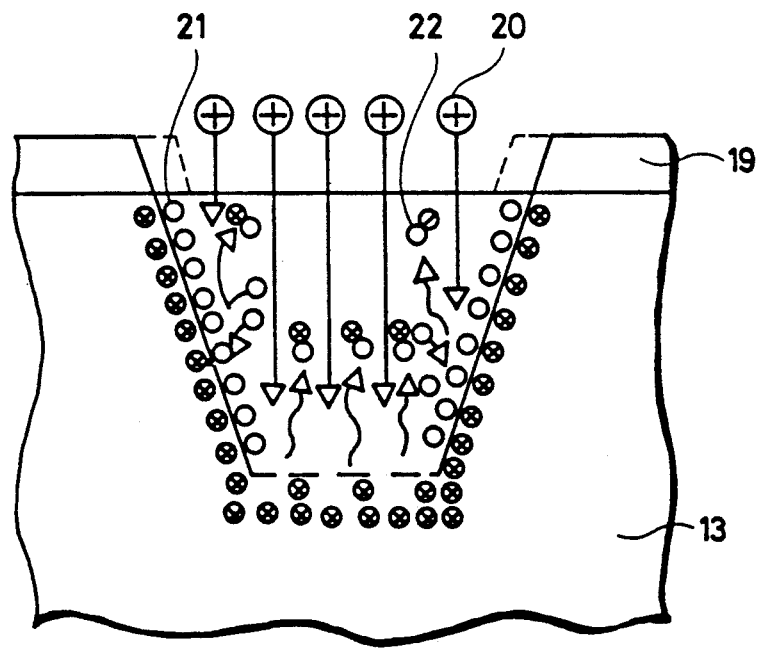
FIG. 6 is a schematic diagram of an etching in the etching step of the concave groove shown in FIG. 5B.

Next, in FIG. 5B, concave grooves 17 of inverse taper configuration are formed in the p-type silicon substrate 13 using the patterned silicon oxide film 19 as an etching mask. The concave grooves 17 are formed by the reactive ion etching. FIG. 6 is a diagram showing a model of etching mechanism for obtaining the configuration of the concave groove 17 shown in FIG. 5B. Generally in the reactive ion etching, reactive species absorbed on a surface to be etched are activated by ion impact so as to react with a substance to be etched. Ions 20 are injected perpendicular to an etching surface of the substance to be etched (in this case, p-type silicon substrate 13). Thus, the reaction proceeds only toward vertical direction. In addition, although the active products 22 are attached to the etched sidewall, the ions 20 are injected only perpendicularly, so that the sidewall is not etched. At this stage, a silicon oxide film is used as the etching mask 19, SiCl$_4$/X containing gas as etching gas, and for example, a pressure in an etching chamber is increased, so that a taper etching of the concave groove 17 as shown in FIG. 5B is accomplished. More specifically, as a pressure in a reactive atmosphere becomes higher, an etching rate of the silicon substrate 13 loses in speed, and on the contrary, selectivity for the silicon oxide film 19 is improved. Accordingly, as an etching step proceeds, the etching mask 19 is partially removed, so that the sidewall slants a little. Frequency of injecting the ions 20 are fewer on the sidewall which slants a little compared with that on a bottom surface of the etching, thereby suppressing the etching of the vertical direction. Attaching rate of the ion to the sidewall is slower than the etching rate of the sidewall at a higher temperature. Accordingly, growing rate of attachments 21 near an opening portion becomes faster, so that ion injecting portion on the bottom surface becomes gradually smaller than the opening portion, which results in a taper configuration of the etching surface. Furthermore, in FIG. 5C, the silicon oxide film 19 is removed by the wet chemical etching. Then, a thick polycrystalline silicon layer 23 containing arsenic (As) is deposited on the surface of the silicon substrate 13 by the CVD (Chemical Vapor Deposition) method. Thereafter, a surface of the polycrystalline silicon layer 23 is flattened by the etch back. More specifically, a resist 24 is coated over the surface of the deposited thick polycrystalline silicon layer 23.

Figure 5D:
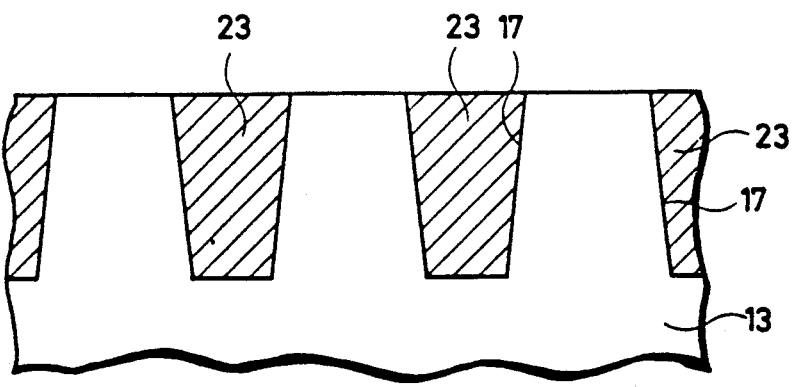

In addition, in FIG. 5D, the resist 24 and the polycrystalline silicon layer 23 are removed by etching at the same etching rate. Then, at a time point when the major surface of the p-type silicon substrate 13 is exposed, etching is finished. The polycrystalline silicon layer 23 is embedded only inside the concave grooves 17 by the above described etch back step.

Figure 5E:
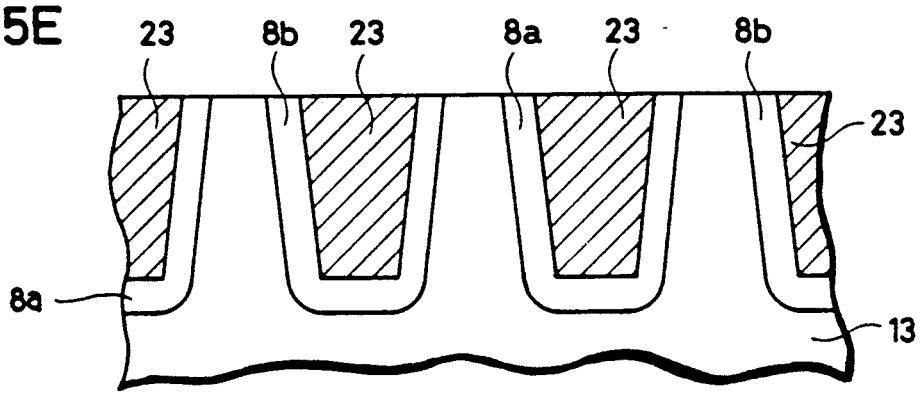

In addition, in FIG. 5E, the arsenic contained inside the polycrystalline silicon layer 23 is diffused in the p-type silicon substrate 13 by thermal process. Then, the source and drain regions 8a and 8b of n-type impurity regions are formed on the bottom surfaces and sidewall surfaces of the concave grooves 17. The source and drain regions 8a and 8b are formed corresponding to the sidewall configuration of the concave groove 17 of taper configuration.

Figure 5F:
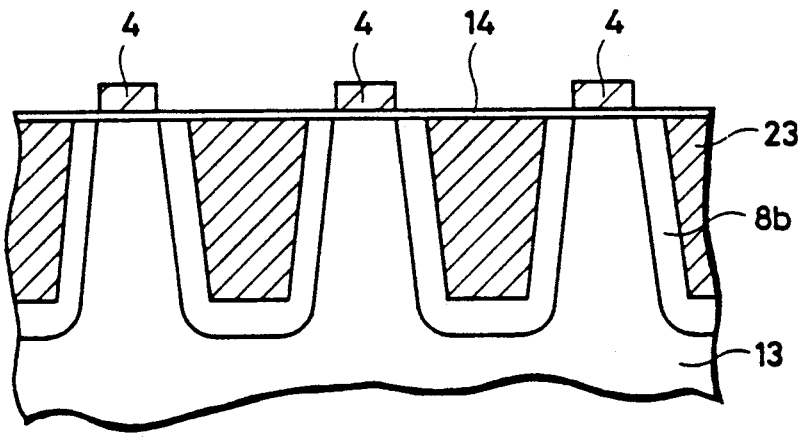

Thereafter, in FIG. 5F, a gate insulating film 14 is formed on the surface of the p-type silicon substrate 13 by the thermal oxidation process. Furthermore, a polycrystalline silicon layer in which arsenic is doped is deposited on the surface of the gate insulating film 14 by the CVD method. Then, the polycrystalline silicon layer is patterned by the photolithography and the etching to form a gate electrode 4.

Figure 5G:
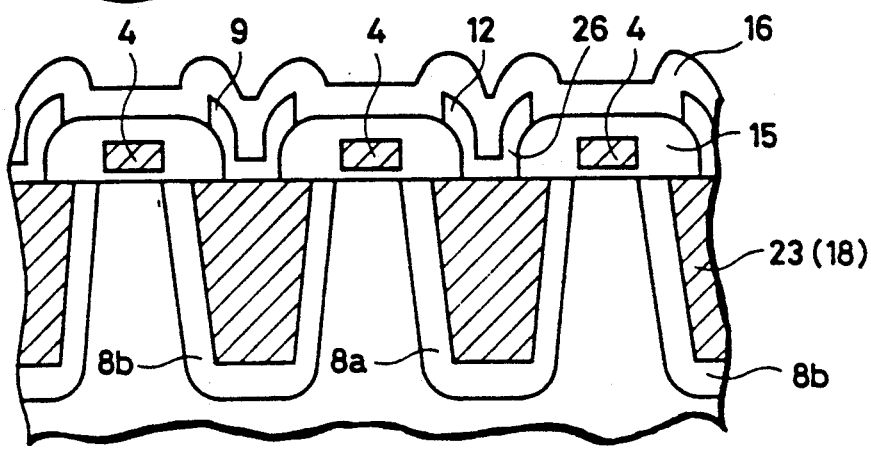

In FIG. 5G, a silicon oxide film 15 is deposited over the gate electrode 4 and the surface of the gate insulating film 14 by the CVD method. Furthermore, predetermined portions of the silicon oxide film 15 on the surface of the polycrystalline silicon layer 23 are removed, so that contact holes 26 are formed. Subsequently, aluminum interconnection layers 9 and 12 are formed in the contact holes 26. Finally, the whole surface of the substrate is covered with a surface protection film 16 of silicon oxide film. Manufacturing of the MIS transistor is accomplished by the above described steps. As described in the foregoing, the MIS transistor employed in the output driver circuit according to the present invention has a source-drain structure having a configuration made optimum by a simulation of the punch through phenomenon, thereby improving a characteristic of a breakdown voltage to an over-current from the external. In addition, formation of the source and drain regions on the sidewall of the concave groove in the substrate enables miniaturization of an element structure. An optimum configuration of the source and drain regions is made by the reactive ion etching in which the reactive pressure is restricted, so that an MIS transistor having an excellent characteristic of breakdown voltage can be manufactured.

Although in the above described embodiments, the explanation was given to a case in which an MIS transistor is employed in an output driver circuit, the application is not specifically limited to those. For example, if a capacity of the punch through current is required in other circuits, the MIS transistor according to the present invention can be applied.

Figure 7:
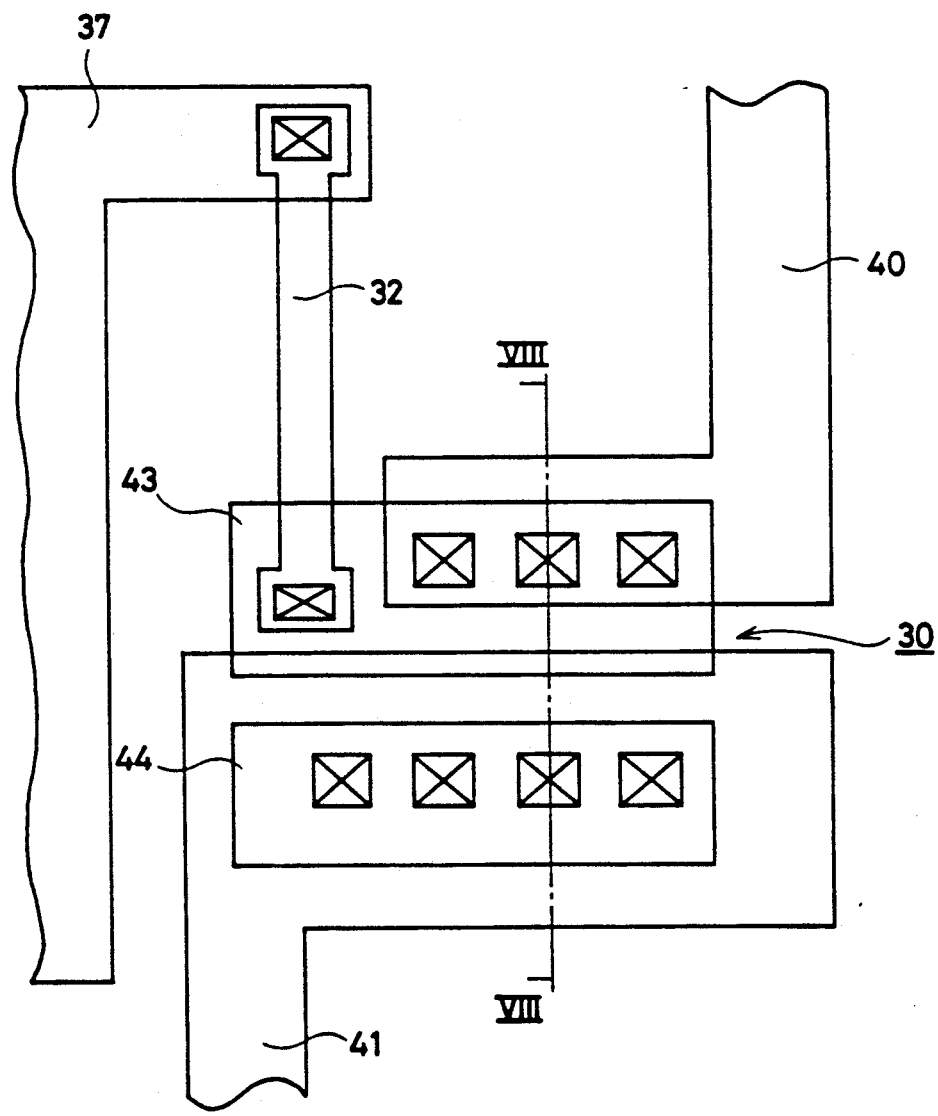
FIG. 7 is a plan view of a structure of an input protection circuit of a second embodiment of the present invention.
Figure 19:
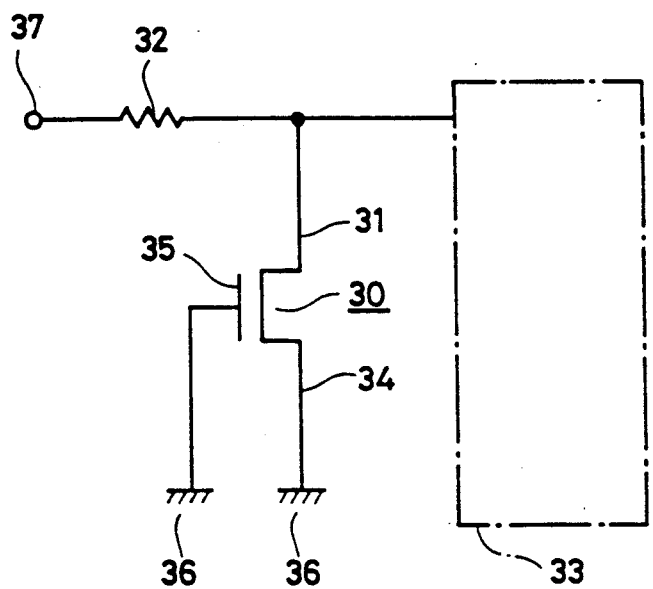
FIG. 19 is an equivalent circuit diagram of an input protection circuit.

Next, an input protection circuit according to a second embodiment of the present invention will be described. Referring to FIG. 19 and FIG. 7, the input protection circuit comprises an MIS transistor 30. An input terminal 37 is connected to a polysilicon resistor 32. The polysilicon resistor 32 is connected to one polysilicon electrode 43 of the MIS transistor 30, and further connected to an aluminum interconnection layer 40 through the polysilicon electrode 43. The aluminum interconnection layer 40 is connected to a circuit 33 to be protected. An aluminum interconnection layer 41 is connected to the other polysilicon electrode 44 of the MIS transistor 30. The aluminum interconnection layer 41 is further connected to a ground potential 36.

Figure 8:
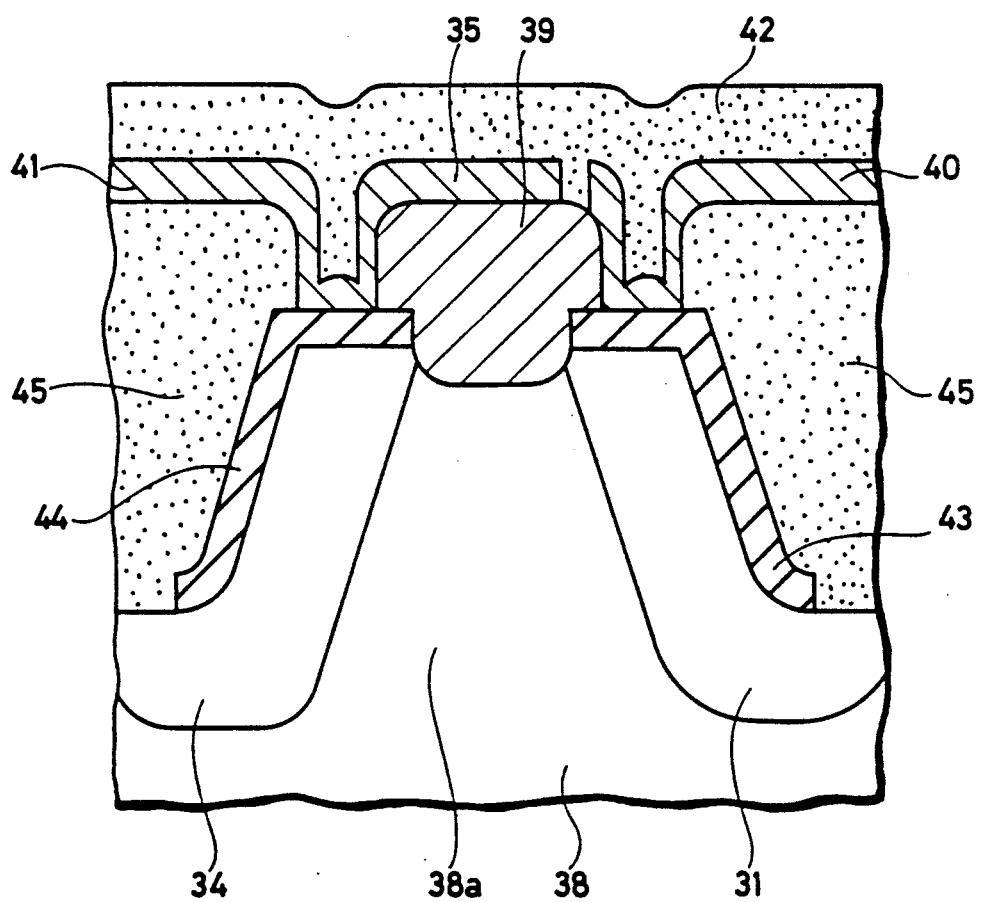
FIG. 8 is a sectional view of a structure of an MIS transistor seen from the direction of a line VIII—VIII of FIG. 7.
Figure 20:
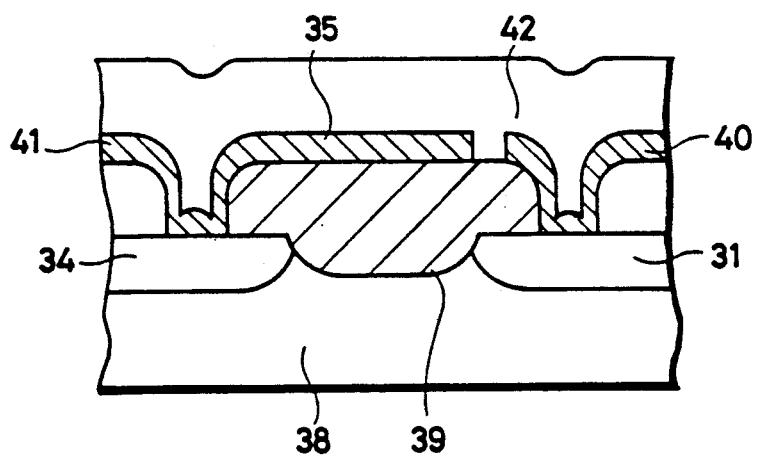
FIG. 20 is a sectional view showing a structure of an MIS transistor employed in a conventional input protection circuit.

Now, referring to FIG. 8, a sectional structure of the MIS transistor 30 will be described. The semiconductor substrate 38 comprises a protrusion 38a. A pair of source and drain regions 34 and 31 are formed on the opposite sides of the protrusion 38a of the semiconductor substrate 38. Opposing areas of the source and drain regions 34 and 31 are enlarged compared with those of the source and drain regions of the conventional MIS transistor shown in FIG. 20. By increasing the opposing areas, an area in which a depletion layer is extended is increased, so that excessive increase of the punch through current density can be prevented. Polysilicon electrodes 44 and 43 in which impurities are doped are formed on the upper surface and the side surface of the source and drain regions 34 and 31. By covering the source and drain regions 34 and 31 with the polysilicon electrodes, generation of a potential difference in a vertical direction in the source and drain regions 34 and 31 is prevented. The aluminum interconnection layer 41 is connected to the polysilicon electrode for the source 44. The aluminum interconnection layer 40 is connected to the polysilicon electrode for the drain 43. In addition, a silicon oxide film 39 is formed on the upper surface of the protrusion of the semiconductor substrate 38. A gate electrode 35 is formed on the upper portion of the silicon oxide film 39, and integrally connected to the aluminum interconnection layer 41. Opposite sides of the protrusion 38a of the semiconductor substrate 38 are embedded in an insulating layer 45. In addition, the aluminum interconnection layers 40, 41 and the like are covered with an insulating film 42.

An operation of the above described input protection circuit will be described. Referring to FIGS. 7, 8 and 19, when an abnormally high voltage is applied to the input terminal 37, a high voltage is applied to the drain region 31 through the aluminum interconnection layer 40 and the polysilicon electrode 43. Then, a depletion layer existing near a boundary between the drain region 31 and the semiconductor substrate 38 is extended toward the source region 34 due to the applied high voltage, thereby communicating with other depletion layer near a boundary between the source region 34 and the semiconductor substrate 38, so that a punch through current flows between the source and drain regions 34 and 31. A configuration of the sidewalls of the protrusion 38a is determined by simulation. More specifically, the configuration of the sidewall surface is selected such that the depletion layer extended from the drain region 31 simultaneously comes in touch with the depletion layer of the source region 34 side from the upper portion through to the bottom portion of the protrusion 38a allowing a punch through current to flow therebetween. The punch through current flows to the ground potential through the polysilicon electrode 44 and the aluminum interconnection layer 41. The high voltage thus applied to the input terminal drops through the resistor 32 because a current flows toward the ground potential 36 due to the punch through phenomenon of the MIS transistor 30. Accordingly, direct application of the high voltage to the circuit to be protected can be prevented.

Thus, in the MIS transistor according to the second embodiment, formation of the source and drain regions on the sidewall surface of the protrusion of the semiconductor substrate enables the reduction of a plane area of the semiconductor substrate.

As described in the foregoing, in the MIS semiconductor device according to the present invention, impurity diffusion regions are formed in concave grooves formed in the substrate so as to form source and drain impurity diffusion regions opposing to each other and extending in the vertical direction of the substrate, wherein a path of the punch through current is enlarged to reduce the current density, thereby providing an input protecting function having high breakdown voltage.

In addition, since the manufacturing method of the MIS semiconductor device according to the present invention makes it possible to form a well-controlled concave groove having a predetermined sidewall configuration in the semiconductor substrate, an MIS semiconductor device having high breakdown voltage can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An MIS semiconductor device comprising:
   a semiconductor substrate of a first conductivity type having a first surface, a second surface approximately parallel to the first surface and separated perpendicularly and upwardly from the first surface, and first and second sidewall surfaces opposed to each other with the second surface provided therebetween and connecting said second sidewall surface and said first sidewall surface,
   an insulating layer formed on said second surface of said semiconductor substrate,
   a gate electrode formed on said insulating layer, and
   a source region and a drain region of a second conductivity type formed substantially along said first and second sidewall surfaces in said semiconductor substrate, respectively,
   wherein said source and drain regions have a configuration corresponding to a surface configuration of said first and second sidewall surfaces, and the configuration of said first and second sidewall surfaces provides a current path area for punch through current between said source and drain regions that extends along substantially the entire length of the source and drain regions on said first and second sidewall surfaces opposed to each other.

2. An MIS semiconductor device according to claim 1, wherein said first and second sidewall surfaces are formed in a taper configuration in which a space between the first and second sidewall surfaces becomes successively wider in a direction from said second surface toward said first surface.

3. An MIS semiconductor device comprising:
a semiconductor substrate including a major surface, a first concave groove including a first sidewall contiguous to one end of a predetermined region of said major surface, and a second concave groove including a second sidewall contiguous to the other end of said predetermined region and opposing said first sidewall,
an insulating layer formed on said major surface over said predetermined region,
a gate electrode formed on said insulating layer, and
a source region and a drain region formed substantially along said first and second sidewall surfaces in said semiconductor substrate, respectively,
wherein said source and drain regions have a configuration corresponding to a surface configuration of said first and second sidewall surfaces, and the configuration of said first and second sidewall surfaces provides a current path area for punch through current between said source and drain regions that extends along substantially the entire length of the source and drain regions.

4. An MIS semiconductor device according to claim 3, wherein
a conductive polycrystalline silicon electrode is embedded in said first and second concave grooves.

5. An MIS semiconductor device according to claim 4, wherein
a surface of said first sidewall and a surface of said second sidewall are formed in a taper configuration in which a space between the surfaces successively becomes wider from said major surface toward bottom portions of said first and second concave grooves.

6. An MIS semiconductor device according to claim 1, wherein
conductive polycrystalline silicon electrode layers are provided on surfaces of said impurity regions formed in said semiconductor substrate.

7. An output driver circuit, comprising: a first MIS transistor comprising
a semiconductor substrate having a major surface, a first concave groove having a first sidewall contiguous to one end of a predetermined region of said major surface, and a second concave groove having a second sidewall contiguous to the other end of said predetermined region and opposing to said first sidewall,
a gate electrode formed on the predetermined region of said major surface through an insulating film, and
source and drain regions formed on a surface of said first sidewall and a surface of said second sidewall,
a second MIS transistor comprising source and drain regions connected to one side of the source and drain regions of said first MIS transistor at a connection point,
a power supply line connected to said drain region of said second MIS transistor,
a ground line connected to said source region of said first MIS transistor, and
first and second input lines connected to said gate electrodes of said first and second MIS transistors and an output line connected to said connection point.

8. An input protection circuit, comprising:
a semiconductor substrate of a first conductivity type having a first surface, a second surface approximately parallel to the first surface and separated perpendicularly and upwardly from the first surface, and first and second sidewall surfaces opposed to each other with the second surface provided therebetween and connecting said second surface and said first surface,
an insulating layer formed on said second surface of said semiconductor substrate,
a gate electrode formed on said insulating layer,
a source region and a drain region of a second conductivity type formed substantially along said first and second sidewall surfaces in said semiconductor substrate, respectively,
wherein said source and drain regions have a configuration corresponding to a surface configuration of said first and second sidewall surfaces, and the configuration of said first and second sidewall surfaces provides a current path area for punch through current between said source and drain regions that extends along substantially the entire length of the source and drain regions on said first and second sidewall surfaces opposed to each other,
first and second polycrystalline silicon electrode layers formed on surfaces of said source and drain regions, respectively,
a first interconnection layer, one end of which being connected to one of said first and second polycrystalline silicon electrode layers, and the other end being connected to an input line, and
a second interconnection layer, one end of which being connected to the other of said first and second polycrystalline silicon electrode layers and said gate electrode, and the other end being connected to a ground potential.

9. An MIS semiconductor device according to claim 8, wherein
said gate electrode is formed of a part of said second interconnection layer.

10. An MIS semiconductor device according to claim 8, wherein
a resistor is connected between said first interconnection layer and said one of polycrystalline silicon electrodes.

11. An output driver circuit according to claim 7, wherein said source and drain regions of first MIS transistor have a configuration corresponding to a surface configuration of said first and second sidewall surfaces, and the configuration of said first and second sidewall surfaces provides a current path area for punch through current between said source and drain regions that extends along substantially the entire length of the source and drain regions on said first and second sidewall surfaces opposed to each other.

* * * * *